US012638491B2

(12) United States Patent
Chen et al.

(10) Patent No.: US 12,638,491 B2
(45) Date of Patent: May 26, 2026

(54) DEVICE VARIATION EXTRACTION CHIP

(71) Applicant: Shanghai Huali Integrated Circuit Corporation, Shanghai (CN)

(72) Inventors: Pinhan Chen, Shanghai (CN); Huafeng Wu, Shanghai (CN)

(73) Assignee: Shanghai Hauli Integrated Circuit Corporation, Shanghai (CN)

( * ) Notice: Subject to any disclaimer, the term of this patent is extended or adjusted under 35 U.S.C. 154(b) by 175 days.

(21) Appl. No.: 18/744,494

(22) Filed: Jun. 14, 2024

(65) Prior Publication Data

US 2025/0102556 A1 Mar. 27, 2025

(30) Foreign Application Priority Data

Sep. 27, 2023 (CN) .......................... 202311266208.3

(51) Int. Cl.
| | |
|---|---|
| *G01R 31/26* | (2020.01) |
| *G01R 31/27* | (2006.01) |
| *G01R 31/28* | (2006.01) |
| *G06F 30/367* | (2020.01) |

(52) U.S. Cl.
CPC ......... *G01R 31/2601* (2013.01); *G01R 31/27* (2013.01); *G01R 31/2886* (2013.01); *G06F 30/367* (2020.01)

(58) Field of Classification Search
CPC G01R 31/2644; G01R 31/2601; G01R 31/27; G01R 31/2884; G06F 30/367
See application file for complete search history.

(56) References Cited

U.S. PATENT DOCUMENTS

| | | | | |
|---|---|---|---|---|
| 9,230,871 | B1 * | 1/2016 | Wang ..................... | H10P 74/277 |
| 10,429,412 | B2 * | 10/2019 | Chan ..................... | G01R 1/0416 |
| 10,605,855 | B2 * | 3/2020 | Wang ................. | G01R 31/2621 |
| 2013/0147510 | A1 * | 6/2013 | Huang .................. | H10W 42/00 |
| | | | | 257/48 |
| 2014/0354325 | A1 * | 12/2014 | Chang .................. | H10P 74/277 |
| | | | | 324/762.09 |
| 2016/0086863 | A1 * | 3/2016 | Won ...................... | H10P 74/207 |
| | | | | 438/197 |

* cited by examiner

*Primary Examiner* — Thang X Le

(74) *Attorney, Agent, or Firm* — Quarles & Brady LLP

(57) ABSTRACT

The present application discloses a device variation extraction chip, including m MOS devices and one test key, where the test key has 2n pads; a drain of the $(k(n-1)+i)$-th MOS device is short-circuited with the i-th pad of the test key; a gate of the $(k(n-1)+i)$-th MOS device is short-circuited with the $(n-1+i)$-th pad of the test key; a source of each of the m MOS devices is short-circuited with the $(2n-1)$-th pad; a bulk of each of the m MOS devices is short-circuited with the 2n-th pad. The device variation extraction chip can save the chip area, save the test time, obtain a large amount of data, and improve the accuracy of the obtained device variation and device mismatch, without the addition of a photomask and process node steps.

5 Claims, 7 Drawing Sheets

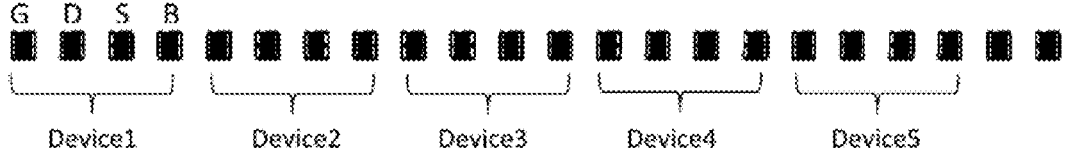
FIG. 1 --Prior Art--
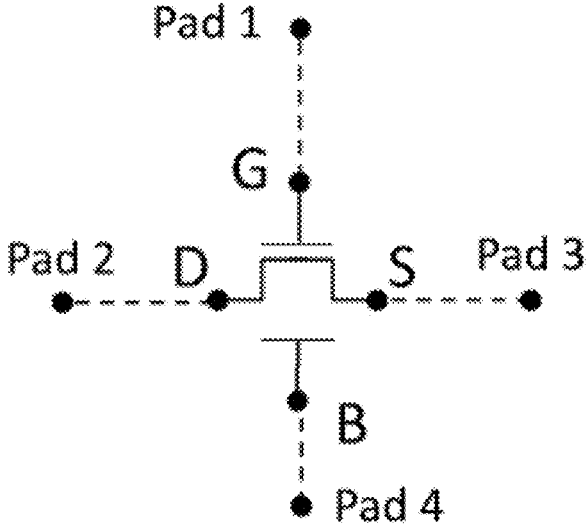
FIG. 2 --Prior Art--

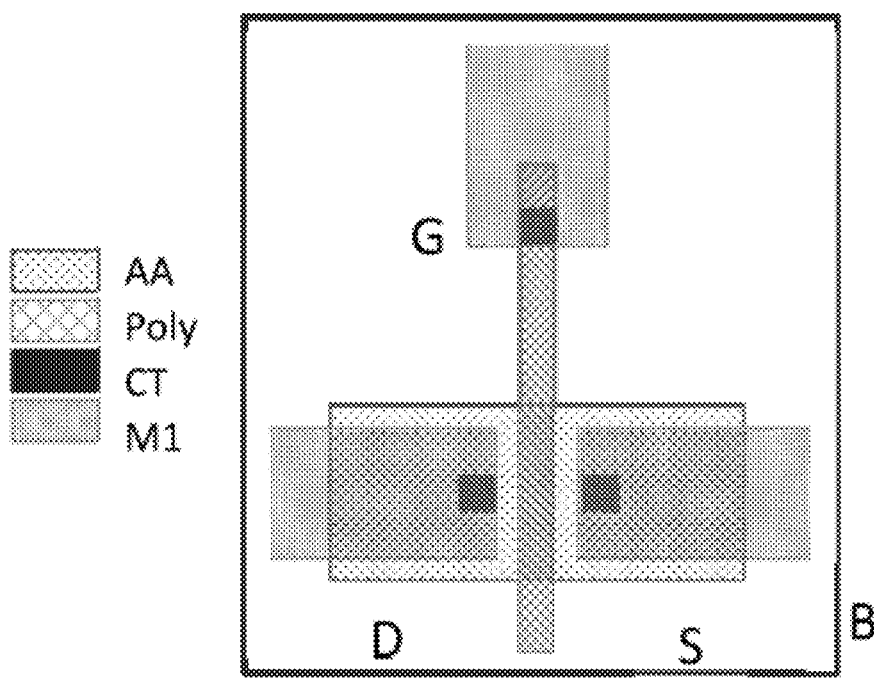
FIG. 3--Prior Art--
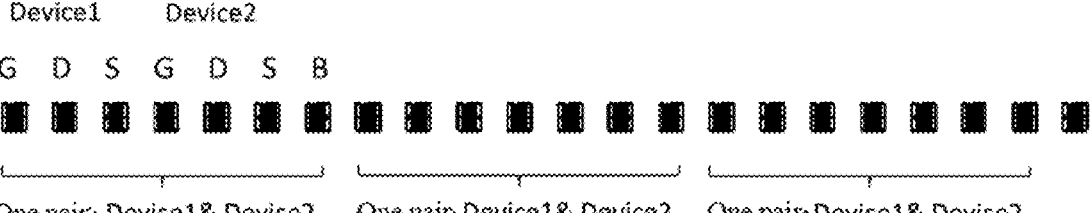
FIG. 4

DEVICE VARIATION EXTRACTION CHIP

CROSS-REFERENCES TO RELATED APPLICATIONS

This application claims priority to Chinese patent application No. 202311266208.3, filed on Sep. 27, 2023 at CNIPA, and entitled "DEVICE VARIATION EXTRACTION CHIP", the disclosure of which is incorporated herein by reference in entirety.

TECHNICAL FIELD

The present application relates to semiconductor circuit design technologies, and particularly to a device variation extraction chip.

BACKGROUND

In the process of semiconductor manufacturing, the purposes of each generation process are directed to miniaturize the device size, increase the performance, decrease the leakage and decrease the operating voltage. From perspective of the chip, the number of transistors are increased, the speed is increased, the power consumption is reduced, and the area is reduced.

When a new process is developed, in the process of device miniaturization, the device width is reduced, the device length is reduced, and the overall device size is reduced. The device essentially varies a lot and is easily affected by the process. A device variation becomes increasingly large, and a device mismatch becomes increasingly large, causing a device failure and even a chip function fail.

In order to measure the device variation and device mismatch, it is required to measure a large amount of device data, so as to determine and analyze a device behavior, and then determine process technologies acting as main impacts and a process technology required to be improved first, or obtain essential properties of the device. The measurement of a large amount of device data requires many resources, a large layout area, and much test time.

In the conventional method, in order to obtain the device variation, a plurality of test keys are required to measure a plurality of devices, and the device variation cannot be calculated until the data amount is sufficiently large.

The measurement of electrical properties of a single device requires the use of four pads to connect the drain, source, gate, and bulk of the device. Generally, referring to FIG. 1, a 22-pad test key can measure only five devices, where a symbolic connection of a single device and the four pads is as shown in FIG. 2, and a layout connection is as shown in FIG. 3.

In the conventional method, a test for the device mismatch uses two adjacent and identical devices as a pair, an electrical property difference between the two devices is referred to as A (delta), and electrical property differences A of many pairs are required as the device mismatch can only be obtained by operating on a plurality of electrical property differences A. In this condition, one pair of devices requires the use of seven pads to connect the drain 1, source 1, and gate 1 of device 1 and the drain 2, source 2, and gate 2 of device 2, and the bulk of the pair of devices share one pad. Typically, a 22-pad test key can measure only three pairs of devices, as shown in FIG. 4. A symbolic connection of one pair of devices and the seven pads is as shown in FIG. 5, and a layout connection is as shown in FIG. 6.

The calculation of the device mismatch requires measurement of a large amount of data and thereby requires more test keys.

BRIEF SUMMARY

The present application is to provide a device variation extraction chip, which can save the chip area, save the test time, obtain a large amount of data, and improve the accuracy of the obtained device variation and device mismatch, without the addition of a photomask and process node steps.

The device variation extraction chip provided by the present application includes m MOS devices and one test key, wherein the test key has 2n pads, n is an integer greater than 4, and m is an integer greater than n−1 and less than or equal to $(n-1)^2$;

a drain of the (k(n−1)+i)-th MOS device is short-circuited with the i-th pad of the test key, i is a positive integer less than or equal to n−1, and k is a natural number less than or equal to n−2;

a gate of the (k(n−1)+i)-th MOS device is short-circuited with the (n−1+i)-th pad of the test key;

a source of each of the m MOS devices is short-circuited with the (2n−1)-th pad;

a bulk of each of the m MOS devices is short-circuited with the 2n-th pad.

In some examples, $m=(n-1)^2$.

In some examples, m is 100, and n is 11;

a drain of the (10k+i)-th MOS device is short-circuited with the i-th pad of the test key, i is a positive integer less than or equal to 10, and k is a natural number less than or equal to 9;

a gate of the (10k+i)-th MOS device is short-circuited with the (10+i)-th pad of the test key;

a source of each of the 100 MOS devices is short-circuited with the 21st pad;

a bulk of each of the 100 MOS devices is short-circuited with the 22nd pad.

In some examples, $m<(n-1)^2$.

In some examples, m is 54, and n is 9;

a drain of the (8k+i)-th MOS device is short-circuited with the i-th pad of the test key, i is a positive integer less than or equal to 8, and k is a natural number less than or equal to 7;

a gate of the (8k+i)-th MOS device is short-circuited with the (8+i)-th pad of the test key;

a source of each of the 54 MOS devices is short-circuited with the 17th pad;

a bulk of each of the 54 MOS devices is short-circuited with the 18th pad.

The device variation extraction chip of the present application is a layout design of an array structure. Based on a 2n-pad test key, a variation extraction structure for a total number of $(n-1)^2$ MOS devices can be designed, which can measure electrical properties (e.g., a threshold voltage Vt, an on current Id, etc.) of the $(n-1)^2$ MOS devices, and can also calculate an electrical property difference between the devices, which is referred to as Δ (delta), using Floor $$\left(\frac{(n-1)^2}{2}\right)$$

3

The layout structure of the device variation extraction chip can be completed using one 2n-pad test key, so that a large number of MOS device electrical property data can be obtained through measurement using a small chip area, thereby reducing the measurement time. The electrical property data may be used to calculate a high-accuracy standard deviation of the device variation and device mismatch, may be used to obtain essential properties of the device and observe the stability of the node process, so as to determine a direction of improvement, improve the electrical properties of the device, and improve the node process, and may further be used to analyze the yield to reduce the research and development cycle time of a chip product and improve the yield of the chip product. The device variation extraction chip can save the chip area, save the test time, obtain a large amount of data, improve the accuracy of the obtained device variation and device mismatch, and save chip development costs, without the addition of a photomask and process node steps.

BRIEF DESCRIPTION OF THE DRAWINGS

In order to more clearly explain the technical solutions of the present application, the drawings required to be used in the present application will be briefly described below. It is obvious that the drawings described below are merely some embodiments of the present application, and those skilled in the art could also obtain other drawings on the basis of these drawings without the practice of inventive effort.

FIG. 1 is a schematic diagram of testing a single device using a 22-pad test key;

FIG. 2 is a schematic diagram of a symbolic connection of a single device and four pads;

FIG. 3 is a schematic diagram of a layout connection of a single device and four pads;

FIG. 4 is a schematic diagram of testing a pair of devices using a 22-pad test key;

DETAILED DESCRIPTION OF THE DISCLOSURE

The technical solutions in the embodiments of the present application will be clearly and completely described below in conjunction with the drawings. Obviously, the described embodiments are only part of the embodiments of the present application, rather than all of the embodiments. Based on the embodiments in the present application, all other embodiments obtained by those skilled in the art without the practice of inventive effort shall fall into the protection scope of the present application.

The terms such as "first" and "second" used in the present application do not indicate any order, quantity, or importance, but are only used to distinguish different constituent parts. The terms such as "include" or "comprise" means that the components or objects in front of these terms cover the components or objects listed after the terms and equivalents thereof, but does not exclude other components or objects. The terms such as "connection" or "coupling" are not limited to physical or mechanical connections, but may include electrical connections, whether direct or indirect. The terms such as "upper", "lower", "left", and "right" are only used to represent relative positional relationships, which may be changed accordingly after absolute positions of the described objects are changed.

It should be noted that the embodiments or features in the embodiments of the present application can be combined with each other in the case of no conflicts.

Embodiment I

Figure 5:
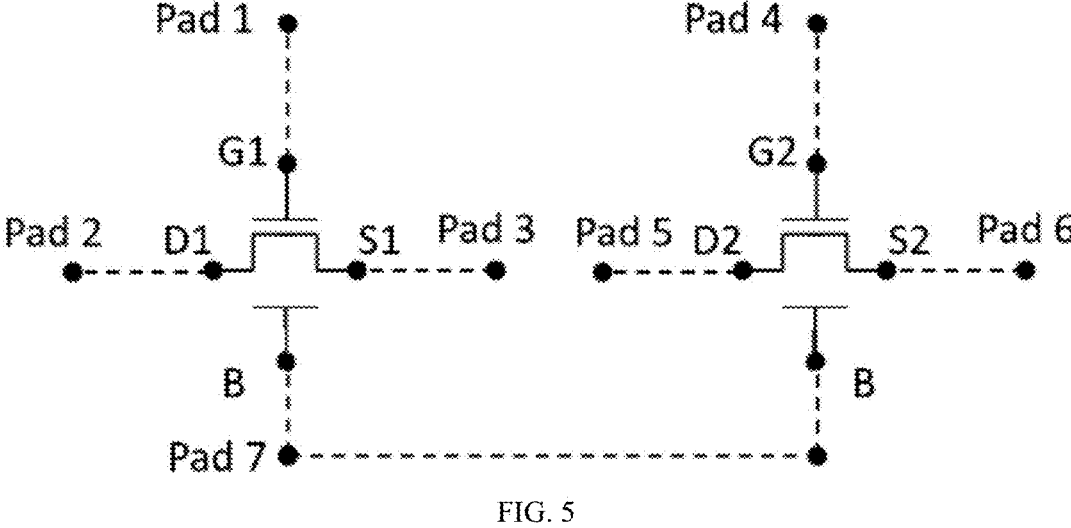
FIG. 5 is a schematic diagram of a symbolic connection of a pair of devices and seven pads.
Figure 6:
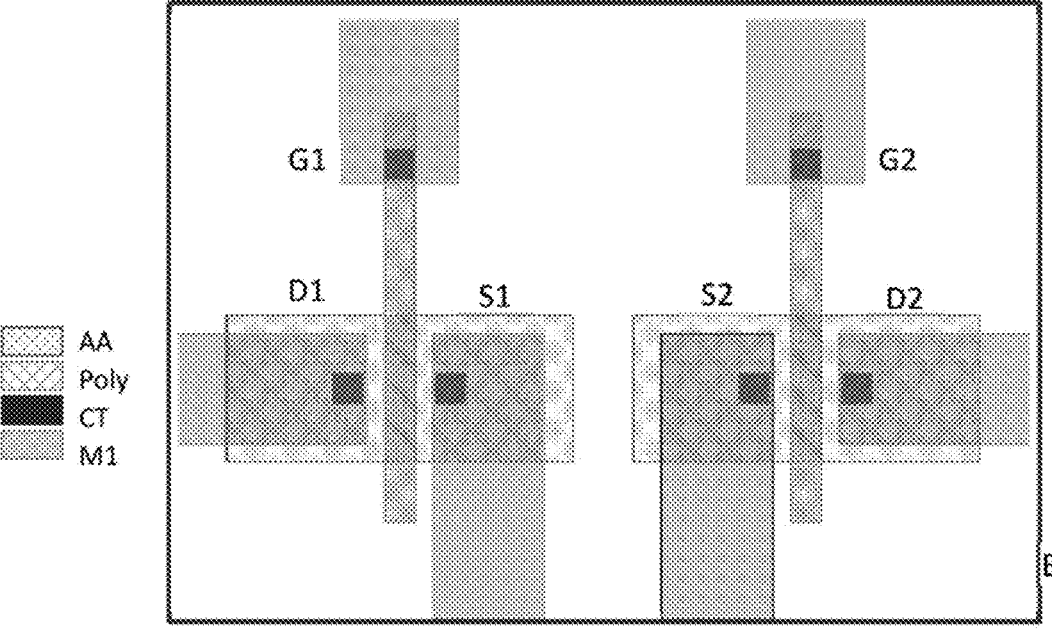
FIG. 6 is a schematic diagram of a layout connection of a pair of devices and seven pads.
Figure 7:
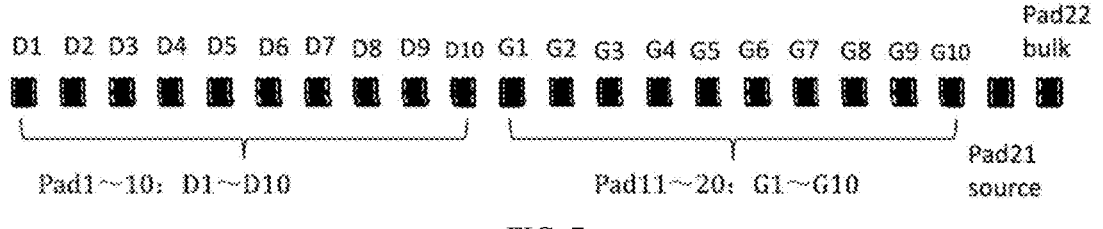
FIG. 7 is a schematic diagram of a test key configuration of an embodiment of a device variation extraction chip of the present application.
Figure 8:
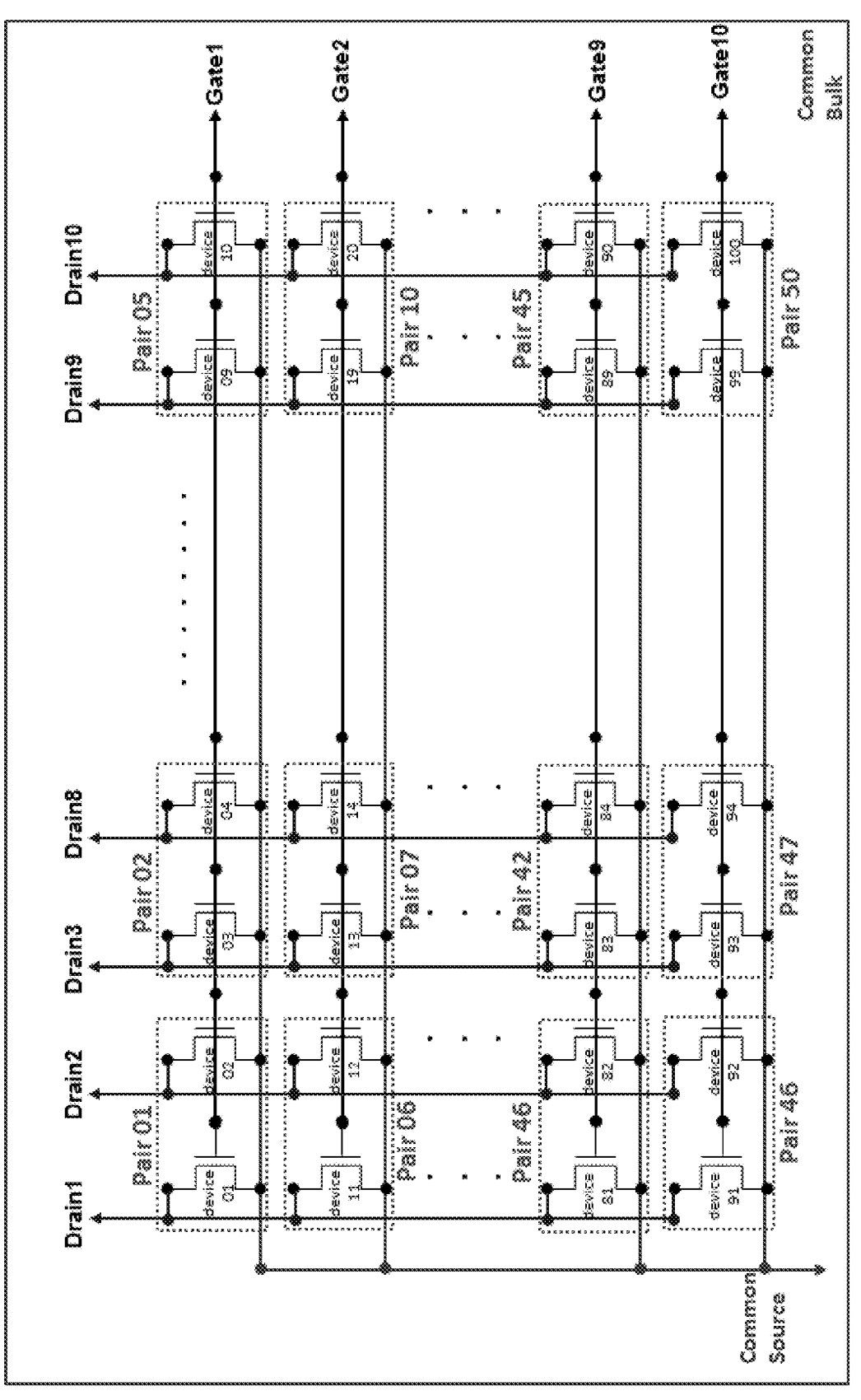
FIG. 8 is a schematic diagram of a symbolic connection of an embodiment of a device variation extraction chip of the present application.
Figure 9:
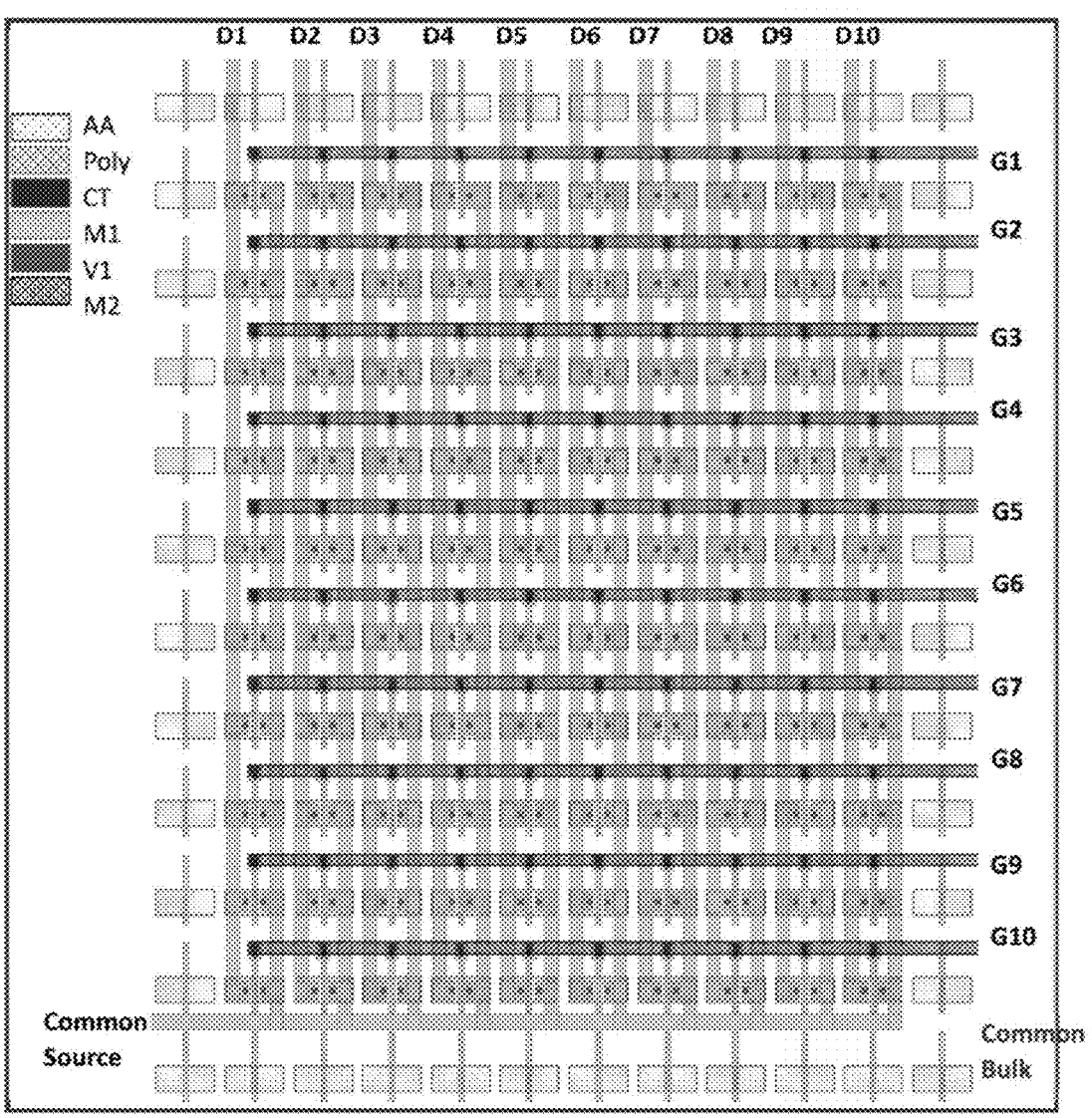
FIG. 9 is a schematic diagram of a layout connection of an embodiment of a device variation extraction chip of the present application.
Figure 10:
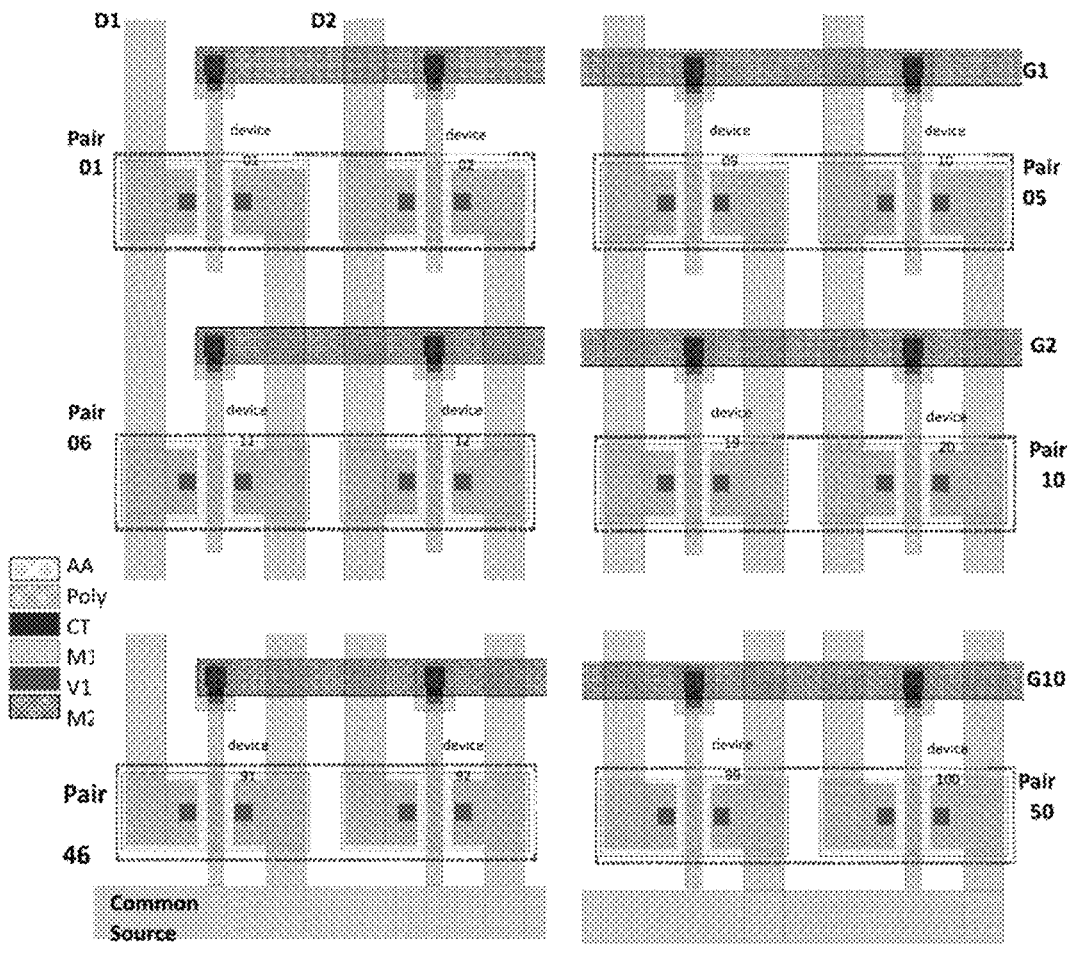
FIG. 10 is a schematic diagram of a part of the layout connection of an embodiment of a device variation extraction chip of the present application.

Referring to FIG. 7, a device variation extraction chip includes m MOS devices and one test key.

Referring to FIG. 7, the test key has 2n pads, n is an integer greater than 4, and m is an integer greater than $n-1$ and less than or equal to $(n-1)^2$.

A drain of the $(k(n-1)+i)$-th MOS device is short-circuited with the i-th pad of the test key, i is a positive integer less than or equal to $n-1$, and k is a natural number less than or equal to $n-2$.

A gate of the $(k(n-1)+i)$-th MOS device is short-circuited with the $(n-1+i)$-th pad of the test key.

A source of each of the m MOS devices is short-circuited with the $(2n-1)$-th pad.

A bulk of each of the m MOS devices is short-circuited with the 2n-th pad.

The device variation extraction chip of Embodiment I is a layout design of an array structure. Based on a 2n-pad test key, a variation extraction structure for a total number of $(n-1)^2$ MOS devices can be designed, which can measure electrical properties (e.g., a threshold voltage Vt, an on current Id, etc.) of the $(n-1)^2$ MOS devices, and can also calculate an electrical property difference between the devices, which is referred to as $\Delta$ (delta), using Floor $$\left( \frac{(n-1)^2}{2} \right).$$

The layout structure of the device variation extraction chip can be completed using one 2n-pad test key, so that a large number of MOS device electrical property data can be obtained through measurement using a small chip area, thereby reducing the measurement time. The electrical property data may be used to calculate a high-accuracy standard deviation of the device variation and device mismatch, may be used to obtain essential properties of the device and observe the stability of the node process, so as to determine a direction of improvement, improve the electrical properties of the device, and improve the process technology, and may further be used to analyze the yield to reduce the research and development cycle time of a chip product and improve the yield of the chip product.

The device variation extraction chip of Embodiment 1 can save the chip area, save the test time, obtain a large amount of data, improve the accuracy of the obtained device variation and device mismatch, and save chip development costs, without the addition of a photomask and process steps.

Embodiment II

In the device variation extraction chip based on Embodiment I, $m=(n-1)^2$.

Embodiment III

In the device variation extraction chip based on Embodiment I, referring to FIG. 7, FIG. 8, FIG. 9, and FIG. 10, m is 100, and n is 11.

A drain of the (10k+i)-th MOS device is short-circuited with the i-th pad of the test key, i is a positive integer less than or equal to 10, and k is a natural number less than or equal to 9.

A gate of the (10k+i)-th MOS device is short-circuited with the (10+i)-th pad of the test key.

A source of each of the 100 MOS devices is short-circuited with the 21st pad.

A bulk of each of the 100 MOS devices is short-circuited with the 22nd pad.

In the device variation extraction chip of Embodiment III, a drain of each of MOS devices 1, 11, 21, 31, 41, 51, 61, 71, 81, and 91 is short-circuited with the first pad (pad 1); a drain of each of MOS devices 2, 12, 22, 32, 42, 52, 62, 72, 82, and 92 is short-circuited with the second pad (pad 2); a drain of each of MOS devices 3, 13, 23, 33, 43, 53, 63, 73, 83, and 93 is short-circuited with the third pad (pad 3), and so on; a drain of each of MOS devices 10, 20, 30, 40, 50, 60, 70, 80, 90, and 100 is short-circuited with the 10th pad (pad 10). A gate of each of MOS devices 1, 2, 3, 4, 5, 6, 7, 8, 9, and 10 is short-circuited with the 11th pad (pad 11); a gate of each of MOS devices 11, 12, 13, 14, 15, 16, 17, 18, 19, and 20 is short-circuited with the 12th pad (pad 12), and so on; a gate of each of MOS devices 91, 92, 93, 94, 95, 96, 97, 98, 99, and 100 is short-circuited with the 20th pad (pad 20). The device variation extraction chip of Embodiment III is based on a 22-pad test key and is designed to obtain a new structure with a total number of 10×10=100 MOS devices, which can measure electrical properties of the 100 MOS devices. Taking a single device as a unit, the device variation of each of the 100 devices (device 01 to device 100) can be measured; and if taking a pair as a unit, an electrical property difference Δ (delta) and a device mismatch of each of 50 pairs (pair 01 to pair 50) can be obtained through measurement and calculation.

Embodiment IV

In the device variation extraction chip based on Embodiment I, $m<(n-1)^2$.

Embodiment V

In the device variation extraction chip based on Embodiment IV, m is 54, and n is 9.

A drain of the (8k+i)-th MOS device is short-circuited with the i-th pad of the test key, i is a positive integer less than or equal to 8, and k is a natural number less than or equal to 7.

A gate of the (8k+i)-th MOS device is short-circuited with the (8+i)-th pad of the test key.

A source of each of the 54 MOS devices is short-circuited with the 17th pad.

A bulk of each of the 54 MOS devices is short-circuited with the 18th pad.

In the device variation extraction chip of Embodiment V, a drain of each of MOS devices 1, 9, 17, 25, 33, 41, and 49 is short-circuited with the first pad (pad 1); a drain of each of MOS devices 2, 10, 18, 26, 34, 42, and 50 is short-circuited with the second pad (pad 2); a drain of each of MOS devices 3, 11, 19, 27, 35, 43, and 51 is short-circuited with the third pad (pad 3); a drain of each of MOS devices 4, 12, 20, 28, 36, 44, and 52 is short-circuited with the fourth pad (pad 4); a drain of each of MOS devices 5, 13, 21, 29, 37, 45, and 53 is short-circuited with the fifth pad (pad 5); a drain of each of MOS devices 6, 14, 22, 30, 38, 46, and 54 is short-circuited with the sixth pad (pad 6); a drain of each of MOS devices 7, 15, 23, 31, 39, and 47 is short-circuited with the seventh pad (pad 7); and a drain of each of MOS devices 8, 16, 24, 32, 40, and 48 is short-circuited with the eighth pad (pad 8).

The device variation extraction chip of Embodiment V is based on an 18-pad test key and is designed to obtain a new structure with a total number of 54 MOS devices, which can measure electrical properties of the 54 MOS devices. Taking a single device as a unit, the device variation of each of the 54 devices (device 01 to device 54) can be measured; and if taking a pair as a unit, an electrical property difference Δ (delta) and a device mismatch of each of 27 pairs (pair 01 to pair 27) can be obtained through measurement and calculation.

The above descriptions are merely examples of the embodiments of the present application and are not intended to limit the present application. Any modifications, equivalent substitutions, improvements, etc. made within the spirit and principles of the present application shall be included within the protection scope of the present application.

What is claimed is:

1. A device variation extraction chip, comprising m metal-oxide semiconductor (MOS) devices and one test key, wherein
   the test key has 2n pads, n is an integer greater than 4, and m is an integer greater than n−1 and less than or equal to $(n-1)^2$;
   a drain of the $(k(n-1)+i)^{th}$ MOS device is short-circuited with the $i^{th}$ pad of the test key, i is a positive integer less than or equal to n−1, and k is a natural number less than or equal to n−2;
   a gate of the $(k(n-1)+i)^{th}$ MOS device is short-circuited with the $(n-1+i)^{th}$ pad of the test key;
   a source of each of the m MOS devices is short-circuited with the $(2n-1)^{th}$ pad;
   a bulk of each of the m MOS devices is short-circuited with the $2n^{th}$ pad.

2. The device variation extraction chip according to claim 1, wherein $$m = (n-1)^2.$$

3. The device variation extraction chip according to claim 1, wherein m is 100, and n is 11;
   a drain of the $(10k+i)^{th}$ MOS device is short-circuited with the $i^{th}$ pad of the test key, i is a positive integer less than or equal to 10, and k is a natural number less than or equal to 9;
   a gate of the $(10k+i)^{th}$ h MOS device is short-circuited with the $(10+1)^{th}$ pad of the test key;

a source of each of the 100 MOS devices is short-circuited with the $21^{st}$ pad;

a bulk of each of the 100 MOS devices is short-circuited with the $22^{nd}$ pad.

4. The device variation extraction chip according to claim 1, wherein $$m < (n-1)^2.$$

5. The device variation extraction chip according to claim 1, wherein m is 54, and n is 9;

a drain of the $(8k+i)^{th}$ MOS device is short-circuited with the $i^{th}$ pad of the test key, i is a positive integer less than or equal to 8, and k is a natural number less than or equal to 7;

a gate of the $(8k+i)^{th}$ MOS device is short-circuited with the $(8+i)^{th}$ pad of the test key;

a source of each of the 54 MOS devices is short-circuited with the $17^{th}$ pad;

a bulk of each of the 54 MOS devices is short-circuited with the $18^{th}$ pad.

* * * * *